United States Patent
Moriwaki (10) Patent No.: US 12,433,009 B2
(45) Date of Patent: Sep. 30, 2025

(54) APPARATUSES INCLUDING A SEMICONDUCTOR TRANSISTOR AND METHODS FOR FORMING SAME

(71) Applicant: MICRON TECHNOLOGY, INC., Boise, ID (US)

(72) Inventor: Yoshikazu Moriwaki, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 426 days.

(21) Appl. No.: 17/857,897

(22) Filed: Jul. 5, 2022

(65) Prior Publication Data
US 2024/0014289 A1    Jan. 11, 2024

(51) Int. Cl.
*H10D 64/68*   (2025.01)
*H01L 21/02*   (2006.01)
*H10D 84/01*   (2025.01)
*H10D 84/03*   (2025.01)

(52) U.S. Cl.
CPC ..... *H10D 64/691* (2025.01); *H01L 21/02181* (2013.01); *H01L 21/02192* (2013.01); *H10D 84/0188* (2025.01); *H10D 84/038* (2025.01); *H01L 2924/01057* (2013.01); *H01L 2924/01072* (2013.01)

(58) Field of Classification Search
CPC ............. H01L 29/517; H01L 21/02181; H01L 21/02192; H01L 2924/01072
See application file for complete search history.

(56) References Cited

U.S. PATENT DOCUMENTS

| | | | | |
|---|---|---|---|---|
| 2008/0048333 | A1* | 2/2008 | Seo | H10B 12/488 438/618 |
| 2009/0124483 | A1* | 5/2009 | Lin | C23C 16/34 501/134 |
| 2013/0320409 | A1* | 12/2013 | Scheiper | H01L 29/66803 257/E21.409 |
| 2015/0255554 | A1* | 9/2015 | Itokawa | H01L 29/40114 257/315 |
| 2019/0013234 | A1* | 1/2019 | Bhattacharyya | H01L 29/40117 |
| 2022/0068715 | A1* | 3/2022 | Waite | H01L 21/823431 |

FOREIGN PATENT DOCUMENTS

CN   101159292 A  *  4/2008  ........ H01L 29/40114

* cited by examiner

Primary Examiner — Mohammad M Choudhry
(74) Attorney, Agent, or Firm — Dorsey & Whitney LLP (57) ABSTRACT

Apparatuses including a semiconductor transistor and methods for forming same are described. An example apparatus includes an active region in a semiconductor substrate, an isolation region configured to isolate the active region, and a gate structure on the active region. The isolation region includes a dielectric material with an addition of a metal material in the dielectric material. The gate structure has portions overlapping the isolation region. The gate structure includes a gate, and further includes a gate insulator that includes a film of the metal material and is disposed between the active region and the gate.

22 Claims, 9 Drawing Sheets

APPARATUSES INCLUDING A SEMICONDUCTOR TRANSISTOR AND METHODS FOR FORMING SAME

BACKGROUND

In semiconductor memory devices, data may be stored in individual memory cells of the memory device. The memory cells may be organized in an array of rows and columns. Each memory cell in a row may be coupled to a word line and each memory cell in a column may be coupled to a bit line. Thus, every memory cell is coupled to a word line and a bit line. Logic circuits peripheral to the memory array may control various memory functions, for example, accessing one or more memory cells of the memory array to read data from or write data to the memory cells.

Transistors included in semiconductor devices, such as field-effect transistors, aim to achieve high performance and low power, at the same time higher density and low cost are still demanded. High Performance CMOSs (HPC) are becoming more popular in semiconductor devices such as memories and logic circuits. HPCs may rely on thin high-k gate insulators with high dielectric constants to provide their high performance with low power and reduced leakage current. However, HPCs may be susceptible to Local Layout Effect (LLE). LLE include effects that alter characteristics and performance of the transistors due to layout design. An example effect is variance in threshold voltage (Vt) of HPC transistors within a semiconductor device. There is a need to reduce LLE in semiconductor devices including transistors.

BRIEF DESCRIPTION OF THE DRAWINGS

The drawings illustrate generally, by way of example, but not by way of limitation, various embodiments discussed in the present disclosure, and are not necessarily drawn to scale.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
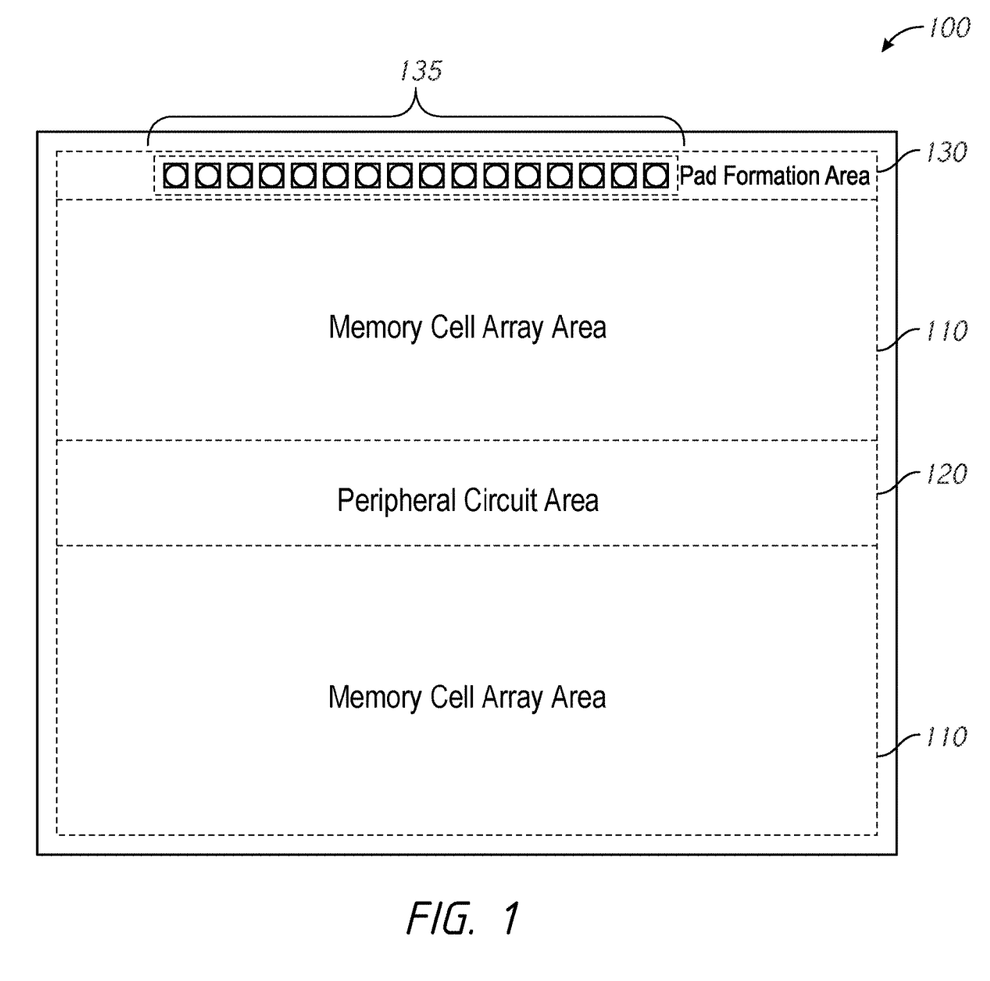
FIG. 1 is a layout diagram of a semiconductor device in accordance with an embodiment of the present disclosure.

FIG. 1 is a layout diagram of a semiconductor device 100 in accordance with one embodiment of the present disclosure. The semiconductor device 100 may include memory cell array areas 110, a peripheral circuit area 120, and a pad formation area 130. In some embodiments of the disclosure, the semiconductor device 100 is a memory device.

The memory cell array areas 110 include memory cells, circuits, and signal lines, for example, sense amplifier circuits, address decoder circuits, data input/output lines, etc. The peripheral circuit area 120 may include various circuits and signal lines for performing various operations of the semiconductor device 100. For example, the peripheral circuit area 120 may include command and address input circuits, address and command decoders, clock circuits, power circuits, and input/output circuits. The peripheral circuit area 120 may also include terminals coupled to various circuits of the semiconductor device. The terminals may be, for example, die pads of the semiconductor device. The pad formation area 130 may include a plurality of bond pads 135. The plurality of bond pads 135 may be coupled to the terminals (e.g., die pads) of the semiconductor device 100 and represent external terminals of the semiconductor device 100. For example, the plurality of bond pads 135 may include data terminals, command and address terminals, clock terminals, and/or power supply terminals.

Figure 2:
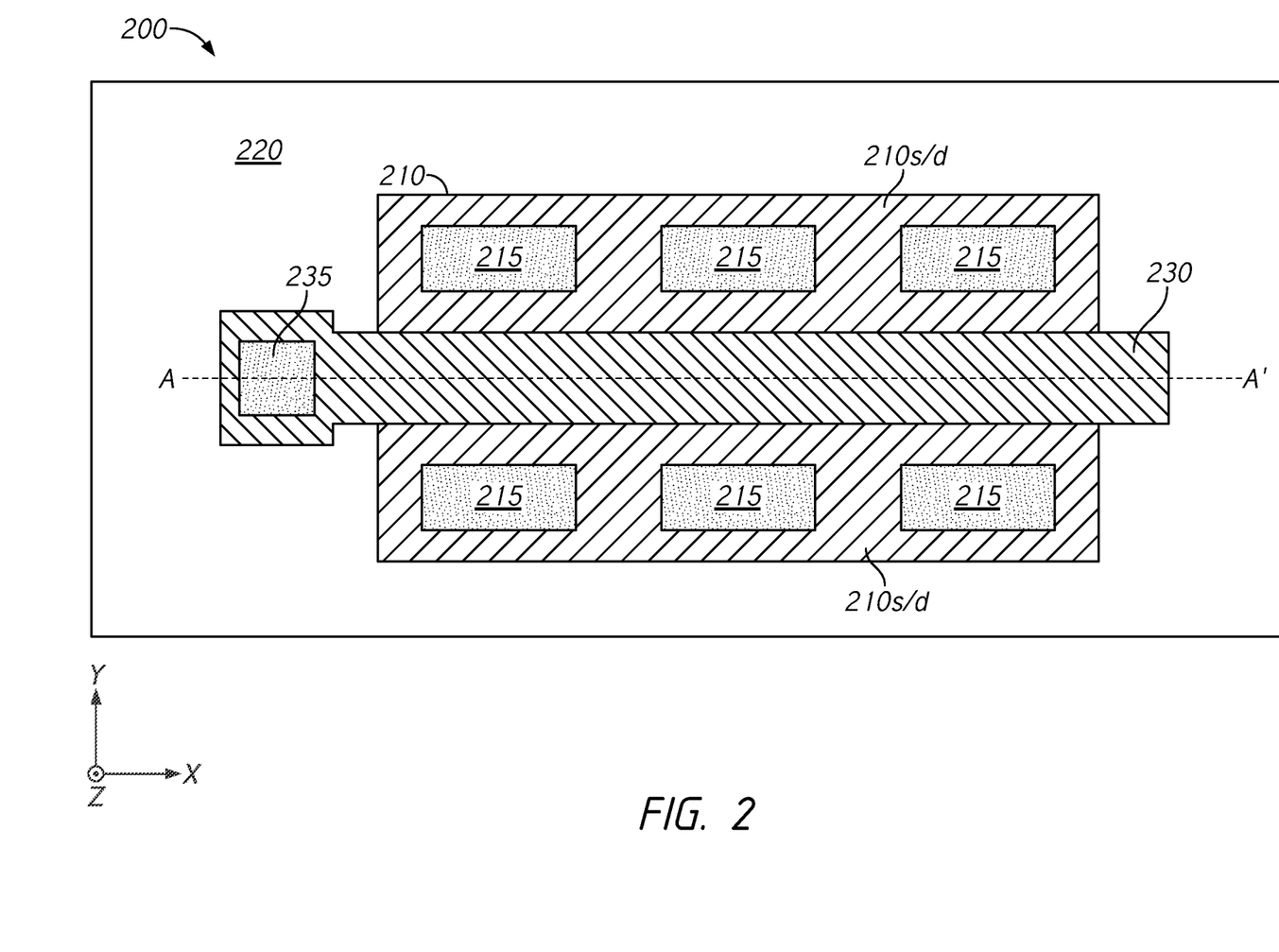
FIG. 2 is a plan view diagram of a field-effect transistor according to an embodiment of the disclosure.

FIG. 2 is a plan view diagram of a field-effect transistor 200 according to an embodiment of the disclosure. The field-effect transistor of FIG. 2 may be included in a circuit, for example, included in the peripheral circuit area 120 of the semiconductor device 100 in some embodiments of the disclosure. In some embodiments of the disclosure, the field-effect transistor may be included in complementary metal oxide semiconductor (CMOS) circuit. In some embodiments of the disclosure, the field-effect transistor may be included in high performance CMOS (HPC) circuits.

The field-effect transistor 200 includes an active region 210 that is formed in a substrate. The active region 210 includes dopants to set the conductivity of the active region 210. The active region 210 is surrounded by an isolation region 220. The isolation region 220 includes a dielectric material, for example, an oxide material (e.g., silicon dioxide SiO2). As will be described in greater detail below, the isolation region 220 includes a metal material that is added to the dielectric material. In some embodiments of the disclosure, the isolation region 220 is a shallow trench isolation. The field-effect transistor 200 further includes a gate structure 230 on the active region 210. The gate structure 230 is a multi-layer stack including multiple layers of materials, which will be described in greater detail below with reference to FIG. 3. The active region 210 is divided into two source/drain regions 210s/d by the gate structure 230. Conductive contacts 215 on the source/drain regions 210s/d and conductive contact 235 on the gate structure 230 provide electrical contact with conductive layers that are formed at a later stage in the fabrication process.

As will be described in more detail below, the isolation region 220 includes a metal material. In some embodiments of the disclosure, the metal material included in the isolation region 220 is also included in the gate structure 230, for example, a gate insulator includes a metal film in the gate structure 230. Including the metal material in the isolation region 220 may reduce diffusion of the metal material from the gate structure 230 into the isolation region 220. Diffusion of the metal material from the gate structure 230 may cause a local layout effect (LLE) of altering the transistor characteristics of the field-effect transistor 200 (e.g., shifting the threshold voltage Vt of the field-effect transistor 200), which is typically undesirable.

Figure 3:
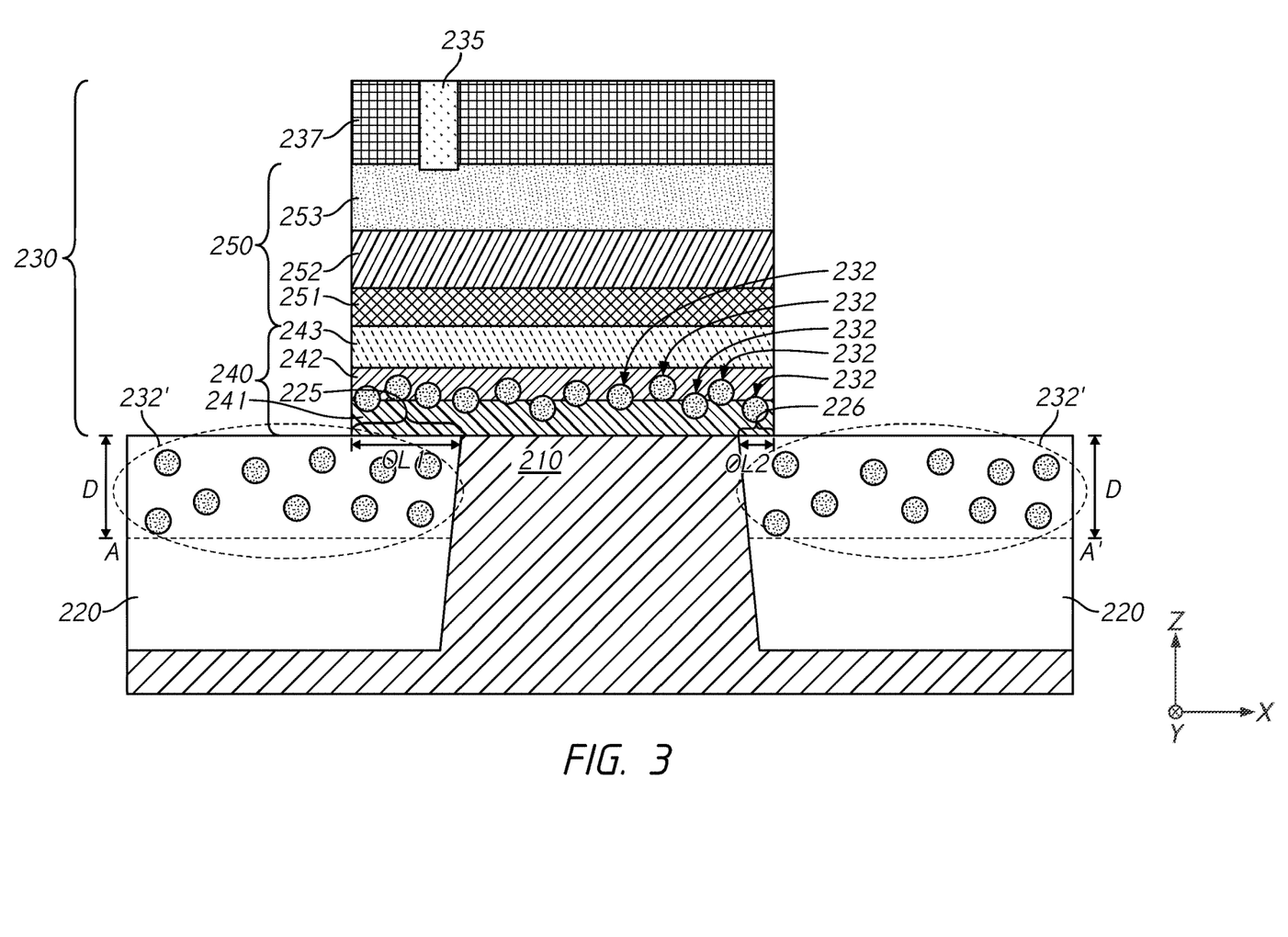
FIG. 3 is a cross section diagram of the field-effect transistor of FIG. 2 according to an embodiment of the disclosure.

FIG. 3 is a cross section diagram of the field-effect transistor 200 of FIG. 2 according to an embodiment of the disclosure. The cross section diagram of FIG. 3 shows the field-effect transistor 200 at line A-A' shown in FIG. 2.

The gate structure 230 of the field-effect transistor 200 is on the active region 210. Portions of the gate structure 230 overlap portions of the isolation region 220 at overlap regions 225 and 226. The overlap region 225 has a width OL1 and the overlap region 226 has a width OL2. In some embodiments, the widths OL1 and OL2 are unequal (e.g., OL1≠OL2). In some embodiments, the widths OL1 and OL2 are equal (e.g., OL1=OL2)

The gate structure 230 includes a gate insulator 240 and a gate 250. The gate insulator 240 is a multi-layer gate insulator including multiple layers. For example, in some embodiments of the disclosure, the gate insulator 240 includes a dielectric layer 241, a layer 242 including a metal material such as a film of the metal material, and a dielectric layer 243. The dielectric layer 241 may include a silicon oxide material as an example (e.g., silicon dioxide). The dielectric layer 243 may include a hafnium oxide material as an example (e.g., hafnium dioxide). The layer 242 includes a metal material 232 to adjust a threshold voltage of the field-effect transistor 200. The metal material 232 may be a source layer of the metal material, which migrates to the interface with the dielectric layers 241 and 243. In some embodiments of the disclosure, the layer 242 includes lanthanum as the metal material 232.

The gate 250 is a multi-layer gate including multiple conductive layers. For example, the gate 250 includes conductive layers 251, 252, and 253. In some embodiments of the disclosure, the conductive layer 251 may include a titanium nitride material, the conductive layer 252 may include a polysilicon material, and the conductive layer 253 may include a metal material (e.g., tungsten silicide). The gate structure 230 may also include a dielectric top layer 237 on the gate 250. The dielectric top layer 237 includes a silicon nitride material, as an example. The conductive contact 235 through the dielectric top layer 237 is electrically connected to the conductive layer 253 of the gate 250 and provides contact with conductive layers that are formed on layers above the field-effect transistor 200.

The isolation region 220 includes a metal material 232', as previously described. In some embodiments of the disclosure, the isolation region 220 includes a metal material 232' that is similar to or the same as the metal material 232 of the layer 242 of the gate insulator 240. For example, the isolation region 220 includes lanthanum when the layer 242 of the gate insulator 240 includes lanthanum.

A metal material 232' is included to the isolation region 220. The metal material 232' may be included proximate to a surface of the isolation region 220. Examples of the metal material 232' that may be added include, for example, lanthanum, magnesium, dysprosium, aluminum, as well as other metal materials. Lanthanum, magnesium, and dysprosium may be used to change a threshold voltage Vt of an n-channel transistor. Aluminum may be used to change a threshold voltage Vt of a p-channel transistor.

In some embodiments of the disclosure, the metal material 232' may be included throughout a depth D from the surface of the isolation region 220. The depth D may be less than or equal 50 nm in some embodiments of the disclosure. In some embodiments of the disclosure, the depth D may be greater than 50 nm.

In some embodiments of the disclosure, a concentration of the metal material 232' added to the isolation region 220 may be based on the depth from the surface of the isolation region 220. For example, the concentration of the metal material in the isolation region 220 may be the concentration throughout the depth D. In some embodiments of the disclosure, the concentration of the metal material 232' in the isolation region 220 is in a range of 5% to 20% throughout the depth D. The range of concentration may be based on atomic percentage, in some embodiments of the disclosure. The concentration of the metal material 232' in the isolation region 220 may also be outside the range of 5% to 20% (e.g., less than 5% or greater than 20%).

In some embodiments of the disclosure, a concentration of metal material 232' in the isolation region 220 may additionally or alternatively be based on a concentration of the metal material 232 of the layer 242 of the gate insulator 240. For example, as the concentration of the metal material 232 of the layer 242 is increased, the concentration of the metal material 232' (e.g., concentration in the depth D from the surface of the isolation region 220) is also increased. Conversely, as the concentration of the metal material 232 of the layer 242 is decreased, the concentration of the metal material 232' is also decreased.

Where a relationship between a thickness of the layer 242 including the metal material 232 and the concentration of the metal material 232 is understood, a concentration of metal material 232' in the isolation region 220 may be based on a thickness of the layer 242. The thickness of the layer 242 may be based on a thickness of the dielectric layer 241 and/or dielectric layer 243. For example, as the dielectric layer 241 and/or dielectric layer 243 is decreased, the thickness of the layer 242 including the metal material is decreased (e.g., the concentration of metal material 232 is decreased). Conversely, as the dielectric layer 241 and/or dielectric layer 243 is increased, the thickness of the layer 242 including the metal material is increased (e.g., the concentration of metal material 232 is increased).

Figure 4:
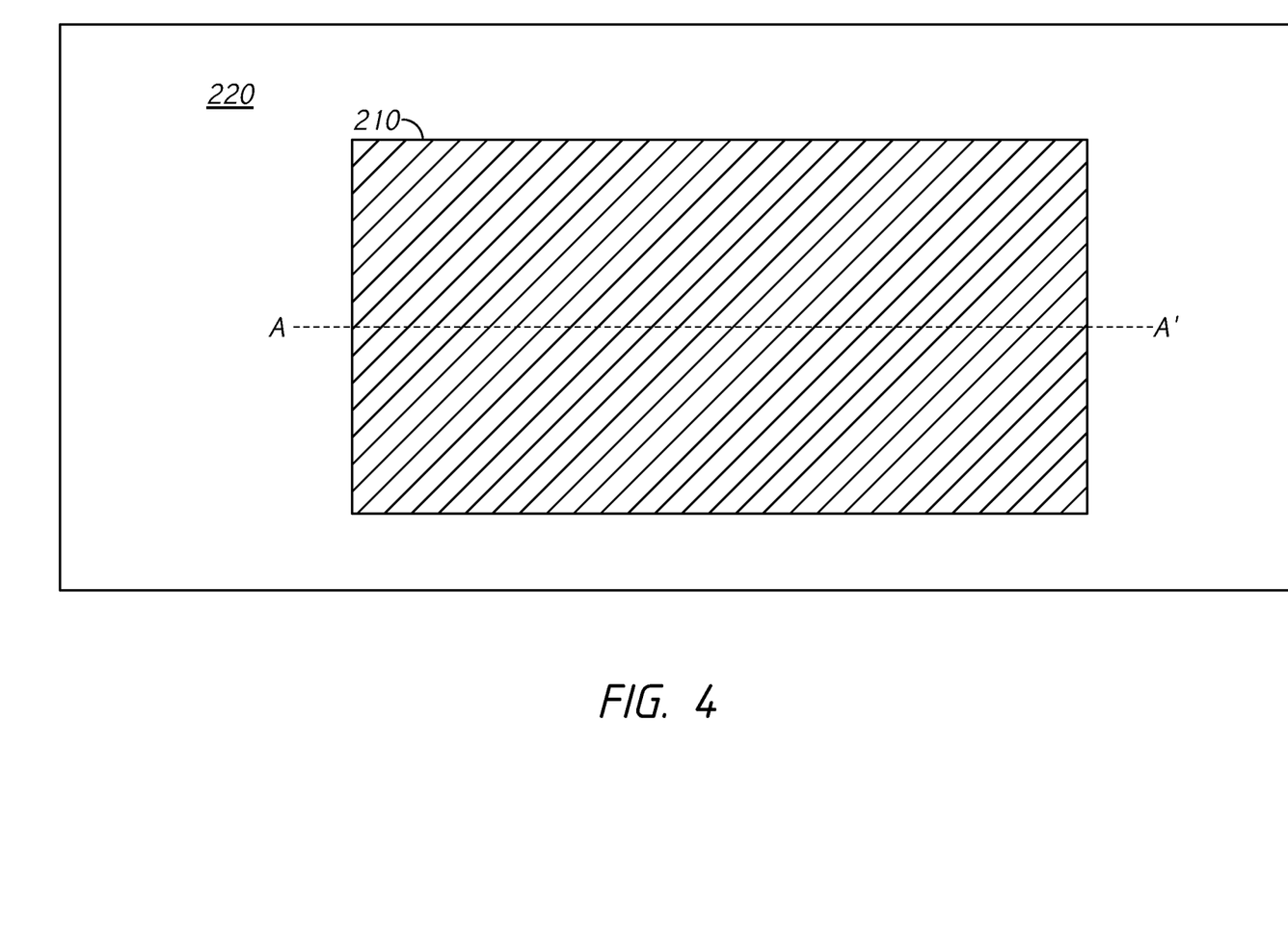
FIG. 4 is a plan view diagram of an intermediate step of the field-effect transistor of FIGS. 2 and 3 according to an embodiment of the disclosure.

FIG. 4 is a plan view diagram of an intermediate step of the field-effect transistor 200 of FIGS. 2 and 3 according to an embodiment of the disclosure. As previously described, the field-effect transistor 200 includes the active region 210 surrounded by the isolation region 220. The active region 210 and the isolation region 220 are included in a semiconductor substrate. The active region 210 may be doped with impurities suitable for a metal-oxide-semiconductor (MOS) field-effect transistor. For example, in some embodiments of the disclosure, the active region may be doped with n- and/or p-dopants for an n-channel MOS field-effect transistor. In some embodiments of the disclosure, the active region may be doped with n- and/or p-dopants for an p-channel MOS field-effect transistor. The isolation region 220 surrounding the active region 210 may include a dielectric material, for example, a material including an oxide. In some embodiments of the disclosure, the isolation region 220 may be a shallow trench isolation (STI) region.

Figure 5:
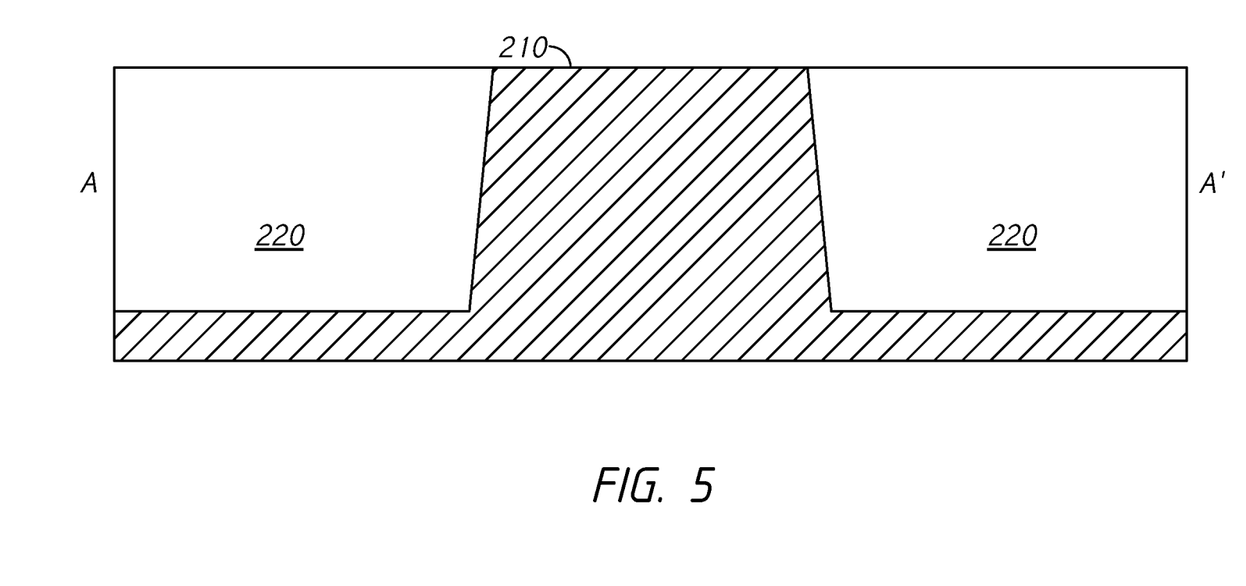
FIG. 5 is a cross-sectional diagram of an intermediate step of the field-effect transistor of FIGS. 2 and 3 according to an embodiment of the disclosure.

FIG. 5 is a cross-sectional diagram of an intermediate step of the field-effect transistor 200 of FIGS. 2 and 3 according to an embodiment of the disclosure. The cross-section of FIG. 5 is taken along line A-A' shown in FIGS. 2 and 4.

The isolation region 220 surrounds the active region 210, and as shown in the cross-sectional view of FIG. 5, the isolation region 220 is adjacent to both sides of the active region 210. As a result, the active region 210, and the field-effect transistor 200 will be laterally isolated from adjacent transistors or other circuits.

Figure 6:
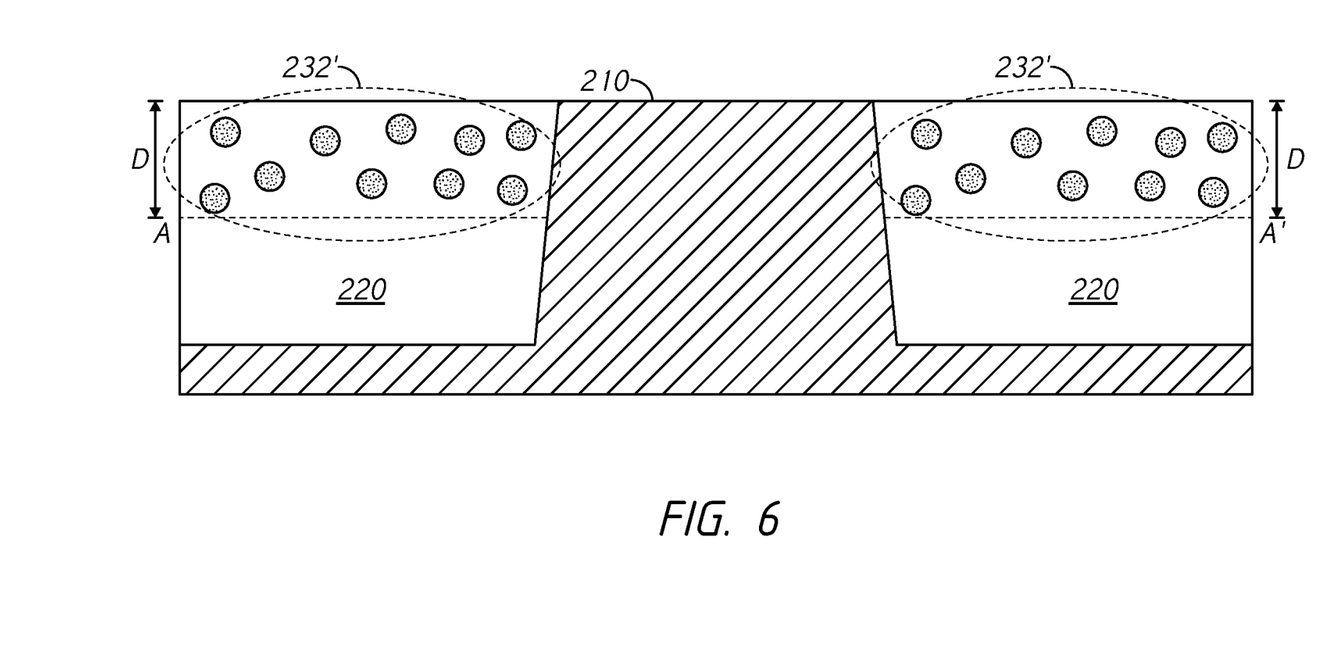
FIG. 6 is a cross-sectional diagram of an intermediate step of the field-effect transistor of FIGS. 2 and 3 according to an embodiment of the disclosure.

FIG. 6 is a cross-sectional diagram of an intermediate step of the field-effect transistor 200 of FIGS. 2 and 3 according to an embodiment of the disclosure. The cross-section of FIG. 6 is taken along line A-A' shown in FIGS. 2 and 4. The intermediate step of FIG. 6 may follow the intermediate step of FIG. 5 in some embodiments of the disclosure.

As previously described with reference to FIGS. 2 and 3, a metal material 232' is included in the isolation region 220. In some embodiments of the disclosure, the isolation region 220 includes a metal material 232' that is similar to or the same as the metal material 232 of the layer 242 of the gate insulator 240. For example, the isolation region 220 includes lanthanum when the layer 242 of the gate insulator 440 includes lanthanum.

As previously described, the metal material 232' may be included proximate to a surface of the isolation region 220. The metal material 232' may be included proximate to a surface of the isolation region 220. Examples of the metal material 232' that may be added include, for example, lanthanum, magnesium, dysprosium, aluminum, as well as other metal materials. Lanthanum, magnesium, and dysprosium may be used to change a threshold voltage Vt of an n-channel transistor. Aluminum may be used to change a threshold voltage Vt of a p-channel transistor.

In some embodiments of the disclosure, the metal material 232' may be included throughout a depth D from the surface of the isolation region 220. The depth D may be less than or equal 50 nm in some embodiments of the disclosure. In some embodiments of the disclosure, the depth D may be greater than 50 nm.

A concentration of the metal material 232' added to the isolation region 220 may be based on the depth from the surface of the isolation region 220. For example, the concentration of the metal material in the isolation region 220 may be the concentration throughout the depth D. In some embodiments of the disclosure, the concentration of the metal material 232' in the isolation region 220 is in a range of 5% to 20% throughout the depth D. The range of concentration may be based on atomic percentage, in some embodiments of the disclosure.

The lanthanum material included in the isolation region 220 may be added using semiconductor fabrication techniques now known or later developed. For example, in some embodiments of the disclosure, the lanthanum material is added to the isolation region 220 using a solid phase diffusion process.

Figure 7A:
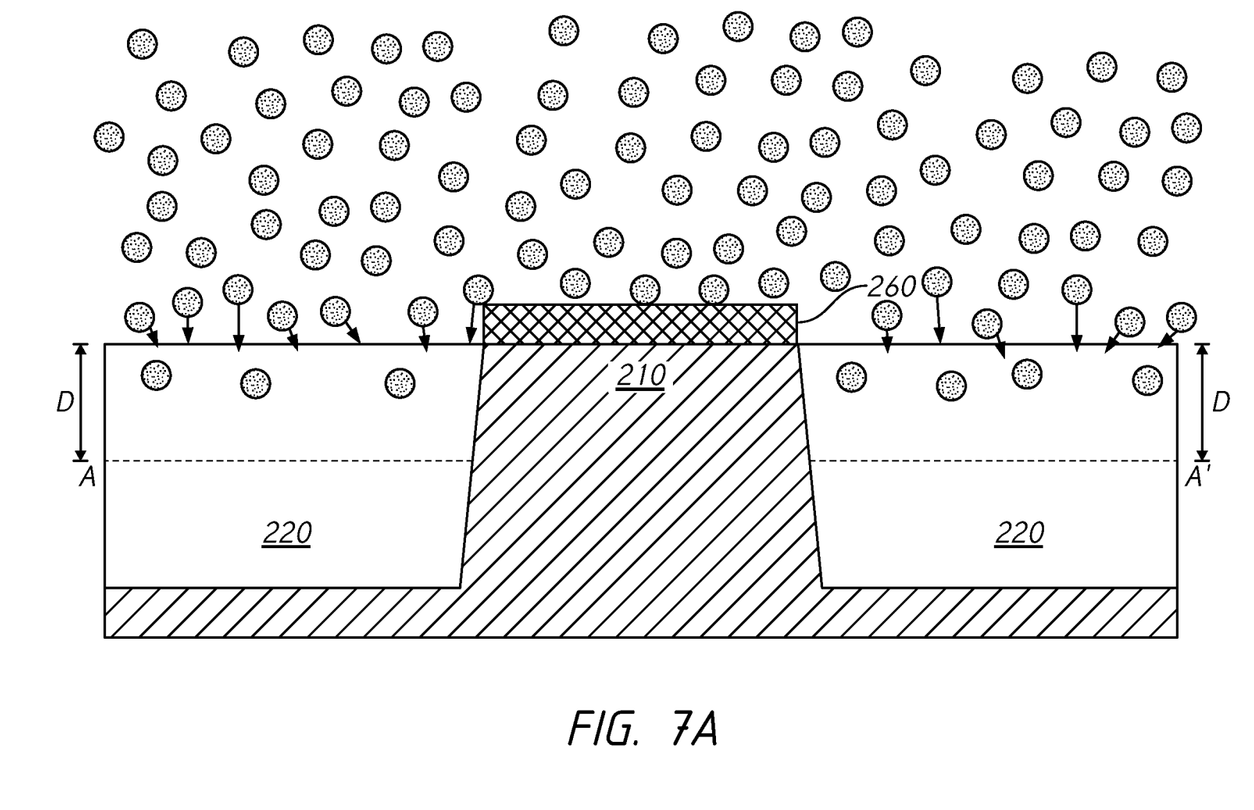
FIGS. 7A and 7B are cross-sectional diagrams of an intermediate step of the field-effect transistor of FIGS. 2 and 3 according to an embodiment of the disclosure.
Figure 7B:
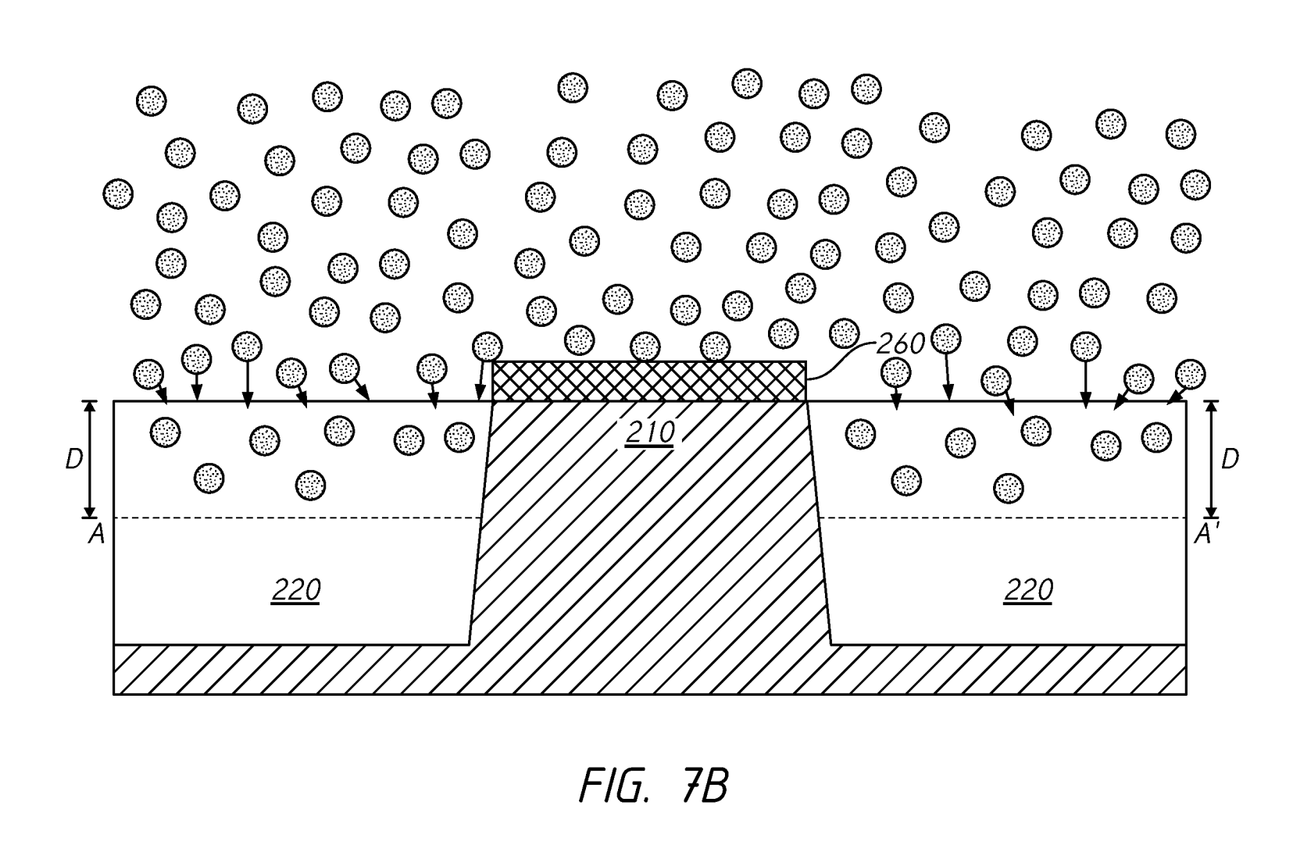

FIGS. 7A and 7B are cross-sectional diagrams of an intermediate step of the field-effect transistor 200 of FIGS. 2 and 3 according to an embodiment of the disclosure. The cross-section of FIGS. 7A and 7B are taken along line A-A' shown in FIGS. 2 and 4. The intermediate step of FIGS. 7A and 7B may follow the intermediate step of FIG. 6 some embodiments of the disclosure.

FIGS. 7A and 7B show a process for adding a metal material 232' to an isolation region 220. FIGS. 7A and 7B may represent a solid diffusion process for adding a lanthanum material to the isolation region 220 in some embodiments of the disclosure. For example, during the solid phase diffusion process, the isolation region 220 may be subjected to a process environment having a higher concentration of lanthanum material than a target concentration of the lanthanum material in the isolation region 220. In such an environment, the lanthanum material is added as it diffuses into to the dielectric material of the isolation region 220. As previously described, in some embodiments of the disclosure the target concentration of the lanthanum material in the isolation region 220 is in a range of 5% to 20% throughout a depth D. The process environment may have an elevated temperature to promote diffusion of the lanthanum material into the isolation region 220.

In some embodiments of the disclosure, a mask 260 is used to prevent the lanthanum material from being added to the active region 210. Masking the active region 210 may include forming the mask 260 prior to the diffusion process. The mask 260 covers the surface of the substrate above the active region 210. A surface of the isolation region 220 remains exposed by the mask 260, however, so that the lanthanum material of the process environment may diffuse into the material of the isolation region 220. The mask 260 may be formed using photolithographic processes to pattern a mask layer, with the mask 260 corresponding to portions of the mask layer that remain after patterning. In some embodiments, the mask 260 is formed from patterned photoresist. In some embodiments, the mask 260 is a hard mask formed, for example, formed from a patterned oxide layer.

As a result of the diffusion process, the lanthanum material diffuses from the higher concentration process environment into the lower concentration of the isolation region 220. The diffusion process continues in order to increase the concentration of the lanthanum material in the isolation region 220, as shown in FIGS. 7A and 7B. The diffusion process is completed when the desired concentration of lanthanum material in the isolation region 220 is reached. For example, the diffusion process is complete when the isolation region 220 includes lanthanum material having a desired concentration throughout depth D as previously described with reference to FIGS. 3 and 6. As previously described, in some embodiments of the disclosure, the concentration of the lanthanum material in the isolation region 220 is in a range of 5% to 20% throughout the depth D.

In some embodiments of the disclosure, the lanthanum material is added to the isolation region 220 using an ion implantation process.

Figure 8:
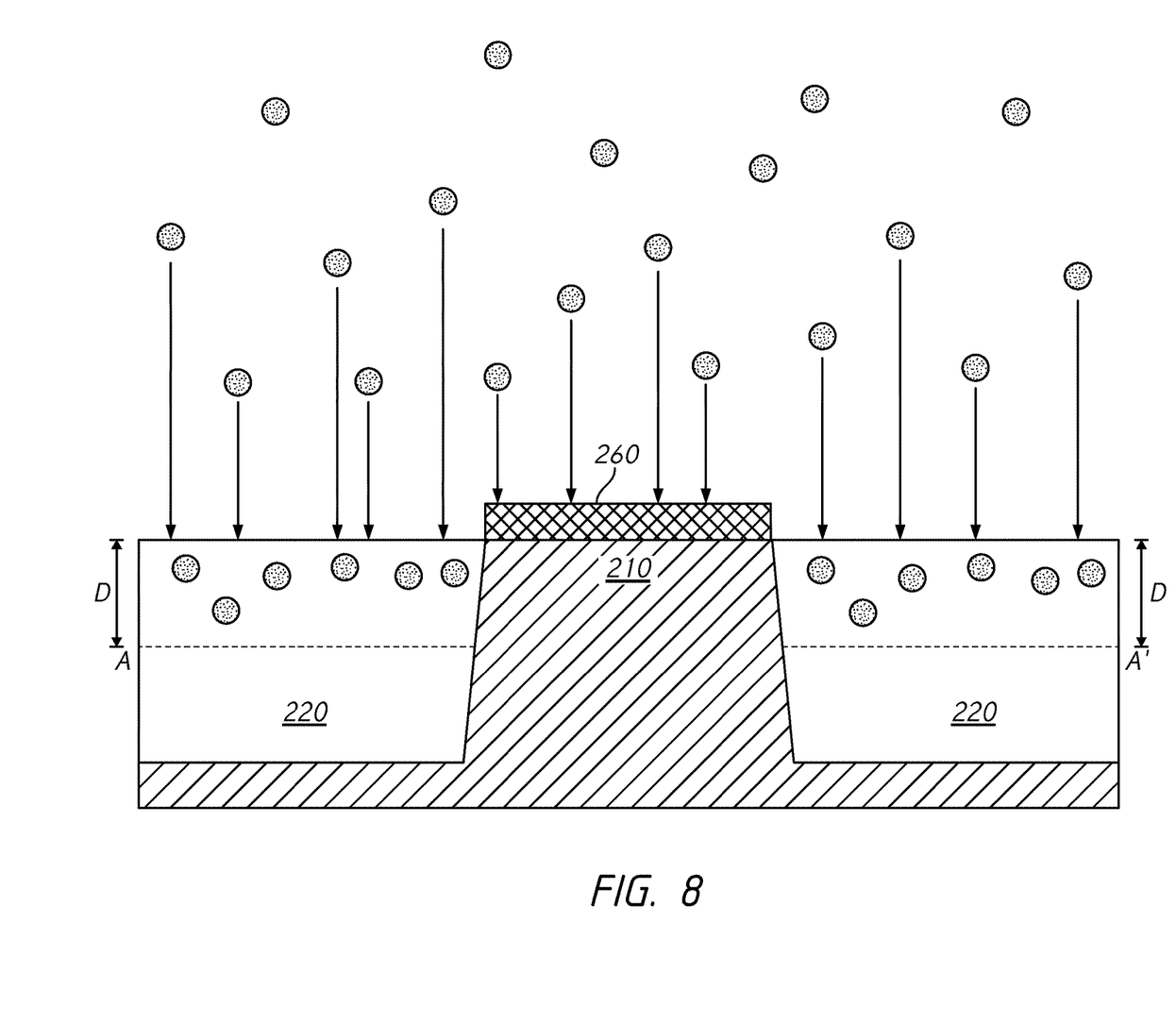
FIG. 8 is a cross-sectional diagram of an intermediate step of the field-effect transistor of FIGS. 2 and 3 according to an embodiment of the disclosure.

FIG. 8 is a cross-sectional diagram of an intermediate step of the field-effect transistor 200 of FIGS. 2 and 3 according to an embodiment of the disclosure. The cross-section of FIG. 8 is taken along line A-A' shown in FIGS. 2 and 4. The intermediate step of FIG. 8 may follow the intermediate step of FIGS. 7A and 7B in some embodiments of the disclosure.

FIG. 8 shows an ion implantation process for adding a material to an isolation region 220 according to an embodiment of the disclosure. During the ion implantation process, the isolation region 220 may be subjected to a process environment having charged lanthanum material accelerated and implanted into the isolation region 220.

In some embodiments of the disclosure, a mask 260 is used to prevent the lanthanum material from being implanted in the active region 210. Masking the active region 210 may include forming the mask 260 prior to the implantation process. The mask 260 covers the surface of the substrate above the active region 210. A surface of the isolation region 220 remains exposed by the mask 260, however, so that the lanthanum material may be implanted into the material of the isolation region 220. The mask 260 may be formed using photolithographic processes to pattern a mask layer, with the mask 260 corresponding to portions of the mask layer that remain after patterning. In some embodiments, the mask 260 is formed from patterned photoresist. In some embodiments, the mask 260 is a hard mask formed, for example, from a patterned oxide layer.

The implantation process continues until the desired concentration of lanthanum material in the isolation region 220 is reached. For example, the implantation is complete when the isolation region 220 includes lanthanum material having a desired concentration throughout depth D as previously described with reference to FIGS. 3 and 6. As previously described, in some embodiments of the disclosure, the concentration of the lanthanum material in the isolation region 220 is in a range of 5% to 20% throughout the depth D.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. As will be appreciated, elements shown in the various embodiments herein can be added, exchanged, and/or eliminated so as to provide a number of additional embodiments of the present disclosure. In addition, as will be further appreciated, the figures are drawn to illustrate various aspects of the embodiments and are not necessarily drawn to scale. Accordingly, the scope of the disclosure should not be limited any of the specific embodiments described herein.

What is claimed is:

1. An apparatus, comprising:
   an active region in a semiconductor substrate;
   an isolation region configured to isolate the active region, the isolation region including a dielectric material with an addition of a first metal material in the dielectric material; and
   a gate structure on the active region and having portions overlapping the isolation region, the gate structure including a gate and a gate insulator, the gate insulator including a film of a second metal material and disposed between the active region and the gate, wherein the second metal material in the gate insulator of the gate structure is the same as the first metal material added to the dielectric material of the isolation region.

2. The apparatus of claim 1 wherein the first and second metal materials comprise lanthanum.

3. The apparatus of claim 1 wherein the metal material comprises at least one of lanthanum, magnesium, dysprosium, and aluminum.

4. The apparatus of claim 1 wherein the isolation region includes the first metal material at a concentration in the range of 5% to 20% based on atomic percentage.

5. The apparatus of claim 4 wherein the isolation region includes the first metal material at a depth less or equal to 50 nm from a surface of the isolation region.

6. The apparatus of claim 1 wherein the isolation region comprises a shallow trench isolation.

7. The apparatus of claim 1 wherein the gate of the gate structure comprises a multi-layer stack including multiple layers of materials.

8. The apparatus of claim 7 wherein the multi-layer stack of the gate comprises a polysilicon layer and a metal layer.

9. The apparatus of claim 1 wherein the gate insulator comprises a multi-layer gate insulator including a dielectric layer and a film of lanthanum as the film of the second metal material.

10. The apparatus of claim 9 wherein the dielectric layer comprises a silicon oxide layer.

11. The apparatus of claim 10 wherein the gate insulator further comprises a hafnium oxide dielectric layer.

12. The apparatus of claim 1 wherein the active region comprises dopants for an n-channel transistor.

13. A semiconductor device, comprising:
    a plurality of memory array regions; and
    a peripheral region between the plurality of memory array regions, the peripheral region including a transistor, the transistor comprises:
    an active region in a semiconductor substrate;
    an isolation region configured to isolate the active region, the isolation region including an additional metal material; and
    a gate structure on the active region and having portions overlapping the isolation region, the gate structure including a gate and a gate insulator disposed between the active region and the gate, wherein the gate insulator includes a film of a metal material, wherein the metal material in the gate insulator of the gate structure is the same as the additional metal material in the isolation region of the transistor.

14. The apparatus of claim 13 wherein the additional metal material and the metal material comprise lanthanum.

15. The apparatus of claim 13 wherein the isolation region includes the metal material at a concentration in the range of 5% to 20% based on atomic percentage.

16. The apparatus of claim 15 wherein the isolation region includes the metal material at a depth less or equal to 50 nm from a surface of the isolation region.

17. The apparatus of claim 13 wherein the gate insulator comprises a hafnium oxide dielectric layer.

18. The apparatus of claim 1, wherein the isolation region includes a shallow trench isolation, the shallow trench isolation includes the dielectric material, and the first metal material is added to the dielectric material within the shallow trench isolation.

19. The apparatus of claim 18, wherein the first metal material is included proximate to a surface of the shallow trench isolation within the shallow trench isolation to reduce diffusion of the second metal material from the gate insulator into the shallow trench isolation.

20. The apparatus of claim 19, wherein the gate insulator includes: a first dielectric layer on the active region, the first dielectric layer having the portions overlapping the isolation region; and a second dielectric layer above the first dielectric layer, wherein the film of the second metal material is provided between the first and second dielectric layers to adjust a threshold voltage of a transistor.

21. The apparatus of claim 13, wherein the isolation region includes a shallow trench isolation, the shallow trench isolation includes the additional metal material proximate to a surface of the shallow trench isolation to reduce diffusion of the metal material from the gate insulator into the shallow trench isolation.

22. The apparatus of claim 21, wherein the gate insulator includes: a first dielectric layer on the active region, the first dielectric layer having the portions overlapping the isolation region; and a second dielectric layer above the first dielectric layer, wherein the film of the metal material is provided between the first and second dielectric layers to adjust a threshold voltage of the transistor.

* * * * *